(12) United States Patent
Zhang (10) Patent No.: US 9,571,116 B2
(45) Date of Patent: Feb. 14, 2017

(54) CIRCUIT AND METHOD OF ADAPTIVE FILTERING DIGITAL CALIBRATION OF ADC

(71) Applicant: SHANGHAI HUAHONG GRACE SEMICONDUCTOR MANUFACTURING CORPORATION, Shanghai (CN)

(72) Inventor: Dongsheng Zhang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/984,096

(22) Filed: Dec. 30, 2015

(65) Prior Publication Data

US 2016/0233875 A1    Aug. 11, 2016

(30) Foreign Application Priority Data

Feb. 10, 2015   (CN) .......................... 2015 1 0067902

(51) Int. Cl.
| | |
|---|---|
| *H03M 1/10* | (2006.01) |
| *H03M 1/00* | (2006.01) |
| *H04L 25/03* | (2006.01) |
| *H03G 3/30* | (2006.01) |
| *H03M 1/12* | (2006.01) |

(52) U.S. Cl.
CPC ......... *H03M 1/1038* (2013.01); *H03M 1/1019* (2013.01); *H03G 3/3052* (2013.01); *H03M 1/00* (2013.01); *H03M 1/12* (2013.01); *H04L 25/03038* (2013.01)

(58) Field of Classification Search
CPC ..... H03M 1/12; H03M 1/00; H04L 25/03038; H03G 3/3052
USPC ......... 341/120, 118, 139, 128; 375/350, 345
See application file for complete search history.

(56) References Cited

U.S. PATENT DOCUMENTS 5,589,881 A * 12/1996 Dunham .................. H03F 1/26
                                                        250/214 A
5,859,881 A *  1/1999 Ferraiolo .............. H04L 7/0331
                                                          341/100

\* cited by examiner

*Primary Examiner* — Joseph Lauture
(74) *Attorney, Agent, or Firm* — MKG, LLC (57) ABSTRACT

An adaptive filtering digital calibration circuit of ADC, which includes a control module, a fixed-point adder, and a fixed-point multiplier; the control module includes a finite-state machine, a shift register, and a register array; the fixed-point adder allows an addend and an augend to be added together after being encoded; the control module controls to complete all the calibration algorithmic operation, which includes the following steps: the control module controls to obtain an original binary value from an external ADC; calculating an error value according to weight and disturbance signals, and carrying out the weight updating operation and the disturbance signal updating operation according to the error value; carrying out the gain calibration operation; and carrying out the final result operation. The present invention also discloses a method of the adaptive filtering digital calibration of ADC.

12 Claims, 3 Drawing Sheets

CIRCUIT AND METHOD OF ADAPTIVE FILTERING DIGITAL CALIBRATION OF ADC

FIELD OF THE INVENTION

The present invention relates to the field of manufacture of a semiconductor integrated circuit, particularly to an adaptive filtering digital calibration circuit of ADC (Analog to Digital Converter); the present invention also relates to a method of adaptive filtering digital calibration of ADC.

BACKGROUND OF THE INVENTION

The main error sources of ADC include comparator offset (Offset), capacitor mismatch (Mismatch), gain error (Gain error), etc., wherein the ADC capacitor mismatch caused by manufacture is impossible to avoid, causing non-linear change of the output characteristic curve of ADC, which influences the performance of ADC the most. Using a large capacitor unit is among the traditional simulation improvement methods, but it will consume the area and power. Or the linear characteristics of ADC are improved by substituting a small capacitor array for the large capacitor array, which, however, will increase the control difficulty and reduce the speed of ADC. Using the method of digital calibration of the adaptive filter algorithm is becoming a mainstream technology of calibrating capacitor mismatch. In an existing adaptive filter algorithm, generally comparing the output signal of ADC with another high-accuracy output signal of ADC to obtain an error value, correcting the weight according to the error value, and repeating the operation, thus finally making the output signal of ADC calibrated.

SUMMARY

A technical problem to be solved by the present invention is to provide an adaptive filtering digital calibration circuit of ADC, which can increase speed and accuracy of the adaptive filtering operation, and has a friendly interface protocol, allowing convenient embedment into various existing ADC logic circuits. For this, the present invention also provides a method of adaptive filtering digital calibration of ADC.

In order to solve the above technical problem, the adaptive filtering digital calibration circuit of ADC provided by the present invention comprises a control module, a plurality of fixed-point adders, and a fixed-point multiplier; the control module comprises a finite-state machine, a shift register, and a register array.

A plurality of the fixed-point adders are used for parallel addition operation, with the individual fixed-point adders including three input terminals and two output terminals, respectively, the three input terminals being used for inputting an addend, an augend and a data encoding indication signal, respectively, one of the output terminals being used for outputting a data overflow indication signal, the other output terminal being used for outputting an addition result; the data encoding indication signal is provided by the finite-state machine and includes four bits, the addend and the augend are changed in format under the control of a two-bit signal of the data encoding indication signal, respectively, and the fixed-point adder carries out an addition operation on the addend and the augend after the change in format.

The control module controls the operational state of the entire adaptive filtering digital calibration circuit and controls to complete all the calibration algorithmic operation, which includes the following steps:

Step 1: The control module controls to obtain a first original binary value from the external ADC and, when a calibration enable signal is in an enable state, to obtain a second original binary value, and then going to Step 2; when the calibration enable signal is in a disable state, the control module controls to obtain the first original binary value before going to Step 4 directly.

Step 2: Calculating an error value according to weight and disturbance signals, and carrying out the weight updating operation and the disturbance signal updating operation according to the error value; after completing the updating operation, judging whether the updating operation has been carried out for M times, wherein M is greater than 1; if the updating operation has been carried out for M times, it is judged whether the error value is less than 2 LSB; if the error value is less than 2 LSB, a gain calibration operation is carried out, with the updated weight as the optimal weight, otherwise the operation is directly stopped, and a high pulse of one cycle is outputted at an "error" port of the control module; if the updating operation is carried out for less than M times, Step 1 will be carried out again.

Step 3: Carrying out the gain calibration operation: first calculating the optimal weight sum, then carrying out a gain correction operation by constantly adjusting a gain coefficient of an output characteristic curve of ADC until a gain error is less than 2 LSB, and then going to Step 4.

Step 4: Carrying out a final result operation: the final result operation means that weighted addition is carried out by a sampling optimal weight on individual bits of the first original binary value to obtain the summed value, which is then multiplied by the gain factor; after the final result operation, giving out a data result from a "bincode" port of the control module, and outputting a high pulse signal of one cycle from a "eoc" port.

As a further improvement, a formula for calculating the error value in Step 2 is as follows:

$$[\text{error}]_c = \sum_{i=0}^{k} \{[2 \times (b_{i+} - b_{i-}) \times w_i]_c\} + [-2 \times \text{diff}]_c$$

Wherein $[\ ]_c$ represents that a complemented code is used for representation; "error" represents an error value; k represents the number of bits of the first original binary value and the second original binary value; bi+ represents the value of the $i^{th}$ bit of the first original binary value; bi− represents the value of the $i^{th}$ bit of the second original binary value; Wi represents the weight value to which the bit of the first original binary value corresponds, with the weight values to which the $i^{th}$ bits of the first original binary value and the second original binary value correspond being the same; and "diff" represents the value of the disturbance signal.

The addition operation in calculation of the error value is carried out by a plurality of the fixed-point adders through parallel operation; when an operand in the addition operation is Wi, the value of the corresponding two-bit data encoding indication signal is {bi+, bi−}; when the operand in the addition operation is "diff", the value of the corresponding two-bit data encoding indication signal is 01.

The shift register carries out operation of moving left by one bit to complete multiplication by 2.

As a further improvement, the weight updating formula in Step 2 is as follows:

$$[W_{i(n+1)}]_c=[W_{i(n)}]_c+U\times[-(b_{i+}-b_{i-})\times \text{error}_{(n)}]_c$$

$W_{i(n)}$ represents a weight value before the $n^{th}$ update to which the $i^{th}$ bit of the first original binary value corresponds; error(n) represents an error value before the $n^{th}$ update; $W_{i(n+1)}$ represents a weight value after the $n^{th}$ update to which the $i^{th}$ bit of the first original binary value corresponds, with the weight updating formula applicable to the weight with the value of i from 0 to k−1; $W_k$ represents a weight value of the highest bit, with the initial value of $W_k$ as a fixed value and not changing during update; when i is from 0 to k−1, the initial value of the weight Wi is 0; U represents a convergence factor; the value of the corresponding two-bit data encoding indication signal is $\{b_{i-}, b_{i+}\}$ when the operand in the weight updating operation is error(n), and it is 10 when the operand is Wi(n).

A formula for updating the disturbance signal in Step 2 is as follows:

$$[\text{diff}_{(n+1)}]_c=[\text{diff}_{(n)}]_c+U\times[\text{error}_{(n)}]_c$$

Wherein $\text{diff}_{(n)}$ represents the value of the disturbance signal before the $n^{th}$ update, and $\text{diff}_{(n+1)}$ represents the value of the disturbance signal after the $n^{th}$ update; the value of the two-bit data encoding indication signal of the addend and augend in the update of the disturbance signal is 10.

As a further improvement, a formula for calculating the optimal weight sum in the gain calibration operation in Step 3 is as follows:

$$[\text{sum\_w}_{quant}]_c = \sum_{i=0}^{k} [W_{iopt}]_c$$

$w_{iopt}$ represents the optimal weight value to which the $i^{th}$ bit of the first original binary value corresponds, k represents the number of bits of the first original binary value and the second original binary value, and $\text{sum\_W}_{quant}$ represents the optimal weight sum.

As a further improvement, the gain correction operation of the gain calibration operation in Step 3 includes the following substeps:

Step 31: Completing the following multiplication operation by the fixed-point multiplier under the control of the control module:

$$\text{sum\_temp}=\text{slope}\times \text{sum\_w}_{quant}$$

Wherein "slope" represents a gain correction coefficient, and sum_temp represents a gain correction coefficient weighted product.

Step 32: Completing the following gain correction error calculation by one of the fixed-point adders under the control of the control module:

$$[\text{slope\_err}]_c=16383+[-\text{sum\_temp}]_c$$

Wherein slope_err represents the gain correction error; the value of the corresponding two-bit data encoding indication signal is 01 when the operand is sum_temp; if the calculated slope_err is less than 2 LSB, it is indicated that the gain correction coefficient has been found, thus going to Step 4 directly, otherwise going to Step 33.

Step 33: Updating the gain correction coefficient by the following formula:

$$[\text{slope}(m+1)]_c=[\text{slope}(m)]_c+[\text{slope\_err}(m)\times 0.5]_c\times 2.44\times 10^{-4}$$

Wherein slope(m) represents the gain correction coefficient of an error value before the $m^{th}$ update, slope(m+1) represents the gain correction coefficient of an error value after the $m^{th}$ update, and slope_err(m) represents the gain correction error before the $m^{th}$ update; slope_err(m) first completes the operation of moving right by 13 bits through the shift register, with the values of the two-bit data encoding indication signal to which the operands slope(m) and slope_err(m) in the addition correspond both being 10; returning to Step 31 after updating the gain correction coefficient.

As a further improvement, a formula for the final result operation in Step 4 is as follows:

$$\text{result} = \left\{\sum_{i=0}^{k} bi\times W_{iopt}\right\}\times \text{slope}$$

Wherein "result" represents a final result; k represents the number of bits of the first original binary value; bi represents the value of the $i^{th}$ bit of the first original binary value when the calibration enable signal is disabled, and bi represents the number of the $i^{th}$ bit of a sum of the first original binary value and the second original binary value when the calibration enable signal is enabled; $W_{iopt}$ represents the optimal weight value to which the $i^{th}$ bit of the first original binary value corresponds; and "slope" represents a gain adjustment coefficient; the addition operation in calculation of the final result operation is carried out by a plurality of the fixed-point adders through parallel operation; with the value of the corresponding two-bit data encoding indication signal determined by bi when the operand in the addition operation is Wiopt, the value of the corresponding two-bit data encoding indication signal is 10 when bi is 1, otherwise 00, with the multiplication operation in the calculation carried out by the fixed-point multiplier.

In order to solve the above technical problem, the method of adaptive filtering digital calibration of ADC provided by the present invention carries out calibration through an adaptive filtering digital calibration circuit, which comprises a control module, a plurality of fixed-point adders, and a fixed-point multiplier; the control module comprises a finite-state machine, a shift register, and a register array.

A plurality of the fixed-point adders are used for parallel addition operation, with the individual fixed-point adders including 3 input terminals and 2 output terminals, respectively, the 3 input terminals being used for inputting an addend, an augend and a data encoding indication signal, respectively, one of the output terminals being used for outputting a data overflow indication signal, the other output terminal being used for outputting an addition result; the data encoding indication signal is provided by the finite-state machine and includes 4 bits, the addend and the augend are changed in format under the control of a two-bit signal of the data encoding indication signal, respectively, and the fixed-point adder carries out an addition operation on the addend and the augend after the change in format.

The control module controls the operational state of the entire adaptive filtering digital calibration circuit and controls to complete all the calibration algorithmic operation, which includes the following steps:

The present invention has the following beneficial effects:
1. Using a simple fixed-point adder, optimizing the adaptive filter algorithm to facilitate the circuit implementation, carrying out the parallel operation efficiently under the control of a control unit, completing quickly the adaptive filter algorithmic operation, calibrating individual bits of the optimal weight value of the high-accuracy ADC, and linearizing the output characteristic curve of ADC.

2. Adding a single-cycle fixed-point multiplier, automatically calibrating the gain error after calibrating the individual optimal weight, adjusting the output characteristic curve of ADC to be a binary result characteristic curve, supporting the use of a non-binary capacitor array, and greatly improving the accuracy and scope of ADC.

3. The digital calibration circuit of the present invention is an independent arithmetic circuit module, and has a friendly interface protocol, allowing convenient embedment into an existing ADC logic circuit.

BRIEF DESCRIPTION OF THE DRAWINGS

The present invention will be further described below in detail with reference to drawings and specific embodiments.

DETAILED DESCRIPTION

Figure 1:
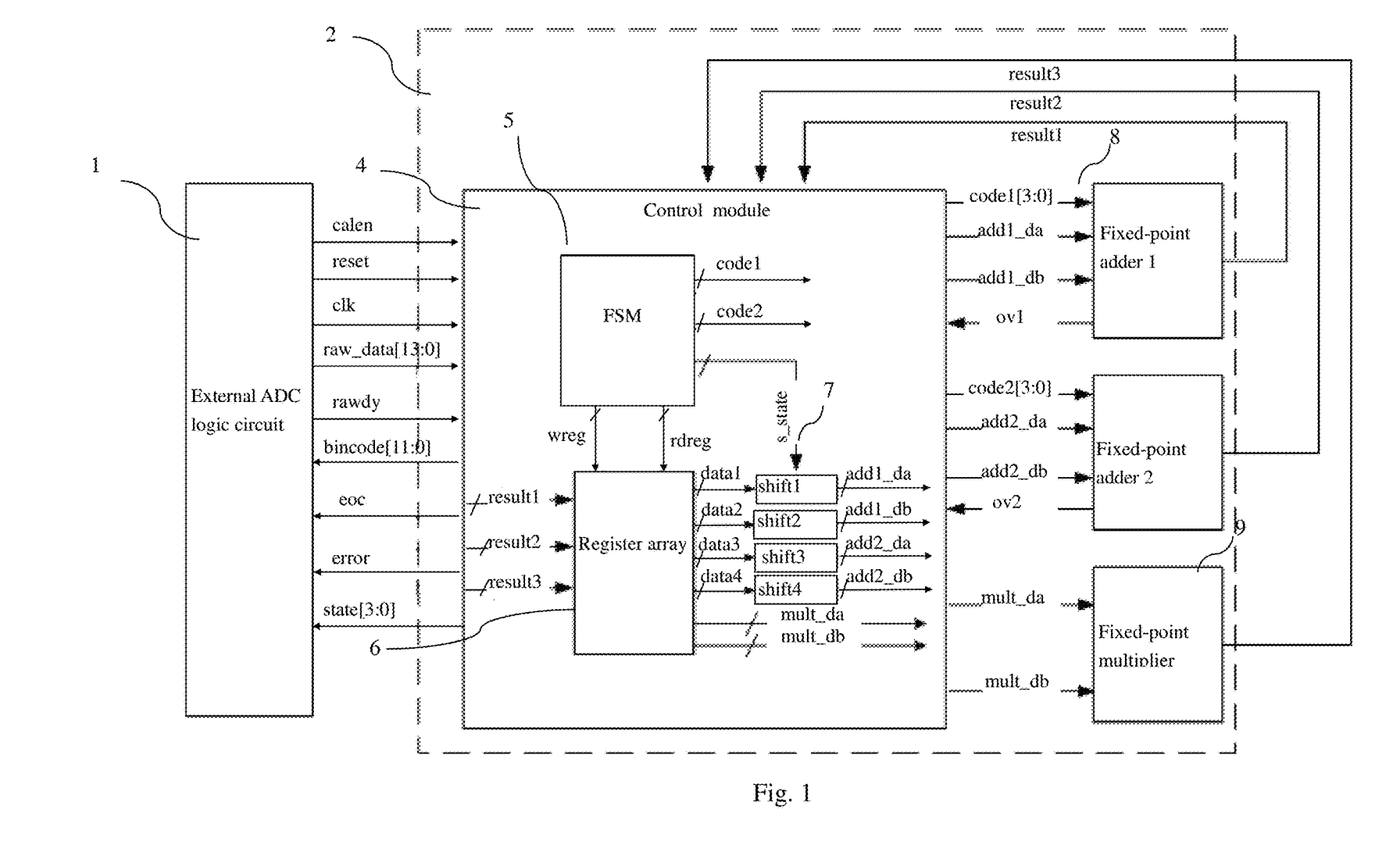
FIG. 1 is a diagram of the adaptive filtering digital calibration circuit of ADC of the example of the present invention.

As shown in FIG. 1 is a diagram of an adaptive filtering digital calibration circuit 2 of ADC of the example of the present invention. The adaptive filtering digital calibration circuit 2 of ADC of the example of the present invention comprises a control module (controller) 4, a plurality of fixed-point adders 8, and a fixed-point multiplier (multiplier) 9; two fixed-point adders 8 are used in the example of the present invention, shown as a fixed-point adder 1 and a fixed-point adder 2 in FIG. 1, respectively; the control module 4 comprises a finite-state machine (FSM) 5, a shift register (shift) 7, and a register array (Register array) 6; there are four shift registers 7 in the example of the present invention that are shown as shift1, shift2, shift2 and shift4, respectively.

Figure 2:
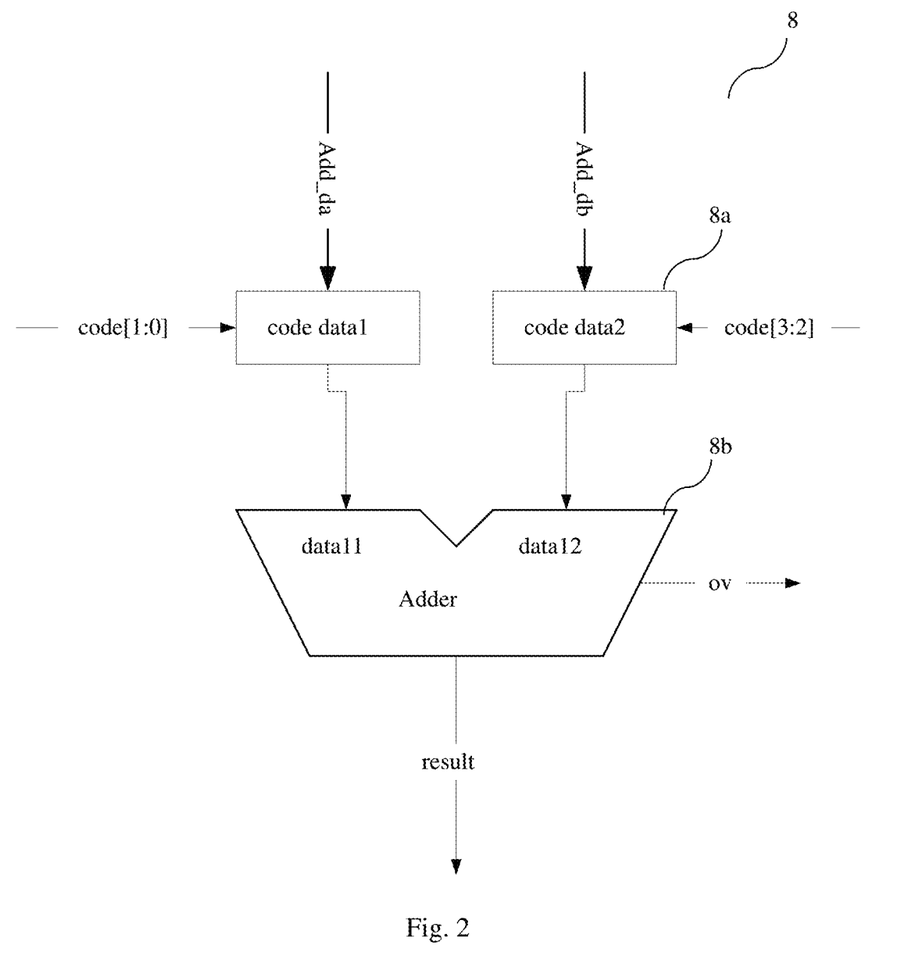
FIG. 2 is a block diagram of realization of the adder in FIG. 1.

A plurality of the fixed-point adders 8 are used for parallel addition operation, as shown in FIG. 2, which is a block diagram of realization of the adder in FIG. 1. Each of the fixed-point adders 8 is a single-cycle signed fixed-point adder, and includes three input terminals and two output terminals, the three input terminals being used for inputting an addend add_da, an augend add_db and a data encoding indication signal code[3:0], respectively, one of the output terminals being used for outputting a data overflow indication signal ov, the other output terminal being used for outputting an addition result; the data encoding indication signal code[3:0] is provided by the finite-state machine 5 and includes four bits, the addend add_da and the augend add_db are changed in format under the control of a two-bit signal of the data encoding indication signal code[3:0], respectively, and the fixed-point adder 8 carries out an addition operation on the addend add_da and the augend add_db after the change in format. It can be known from FIG. 2 that, the fixed-point adder 8 includes two encoders (code data) 8a and one adder 8b, with the two encoders 8 shown as code data1 and code data2, respectively; the addend add_da and the augend add_db are inputted into one encoder 8, respectively, the addend add_da being inputted into code data 1, the augend add_db being inputted into code data2; the front bit of the data encoding indication signal, i.e. code[1:0], is inputted into code data1 for encoding the addend add_da to form a signal data1, and the rear two bits of the data encoding indication signal, i.e. code[3:2], are inputted into code data2 for encoding the addend add_db to form a signal data2, with an adder, i.e. adder8b, used for adding data1 to data2 to form the addition result output.

TABLE 1

| code[1:0] | data11 |
| --- | --- |
| 00 or 11 | 0 |
| 01 | [−add_da]complement |
| 10 | [add_da]complement |

The encoding rule of code data1 in the example of the present invention is as shown in Table 1. When code [1:0] is 00 or 11, data11 is 0; when code [1:0] is 01, data11 is [−add_da] complement, with [ ] complement representing a complemental code; when code[1:0] is 10, data11 is [add_da] complement.

TABLE 2

| code[3:2] | data12 |
| --- | --- |
| 00 or 11 | 0 |
| 01 | [−add_db]complement |
| 10 | [add_db]complement |

The encoding rule of code data2 in the example of the present invention is as shown in Table 2. When code[3:2] is 00 or 11, data12 is 0; when code[3:2] is 01, data12 is [−add_db]complement; when code[3:2] is 10, data12 is [add_db]complement.

The inputted/outputted data to which the fixed-point adder 1 in FIG. 1 corresponds have 1 added to the rear, such as code1 [3:0], add1_da, add1_db, ov1 and result1; the inputted/outputted data to which the fixed-point adder 2 corresponds have 2 added to the rear, such as code2[3:0], add2_da, add2_db, ov2 and result2. As shown in FIG. 1, add1_da, add1_db, add2_da and add2_db are inputted by the data stored in the register array 6, i.e. data1, data2, data3 and data4, after passing a shift register 7, respectively. The fixed-point multiplier 9 is a signed single-cycle fixed-point adder, the two input terminals being used for inputting two data, i.e., a multiplicator mul_da and a multiplicand mul_db, from the register array 6, respectively, the output terminal being used for outputting the data result3. The shift register 7 is controlled by the control signal s_state outputted by FSM5, which also outputs the data encoding indication signals code1 and code2.

The two fixed-point adders 8 in the example of the present invention are a single-cycle signed fixed-point adder, used for completing the addition operation of the adaptive filter algorithm, wherein addx_da and addx_db are the addend and augend, respectively, codex represents the data encoding indication signal, and ovx represents the data overflow indication signal.

In the example of the present invention, after the signal "rawdy" of the control module 4 is elevated, the original binary value raw_data is obtained, and then the operational state of the entire circuit is controlled. Controlling to complete all the algorithmic operation, and then outputting a signal "eoc" of one clock cycle and a signal "bincode" with the correct result of 12 after calibration. The signal "reset" is a system reset signal, the signal "clk" is a work clock signal, the signal "state" is a state indication signal, and the signal "calen" is a calibration enable signal; effectively coordinating parallel work of the three operation cells of the fixed-point adders 1 and 2 and the multiplier according to the operational state, and completing the algorithmic operation quickly. All the data operation accuracy in the example of the present invention is 28 bit.

Figure 3:
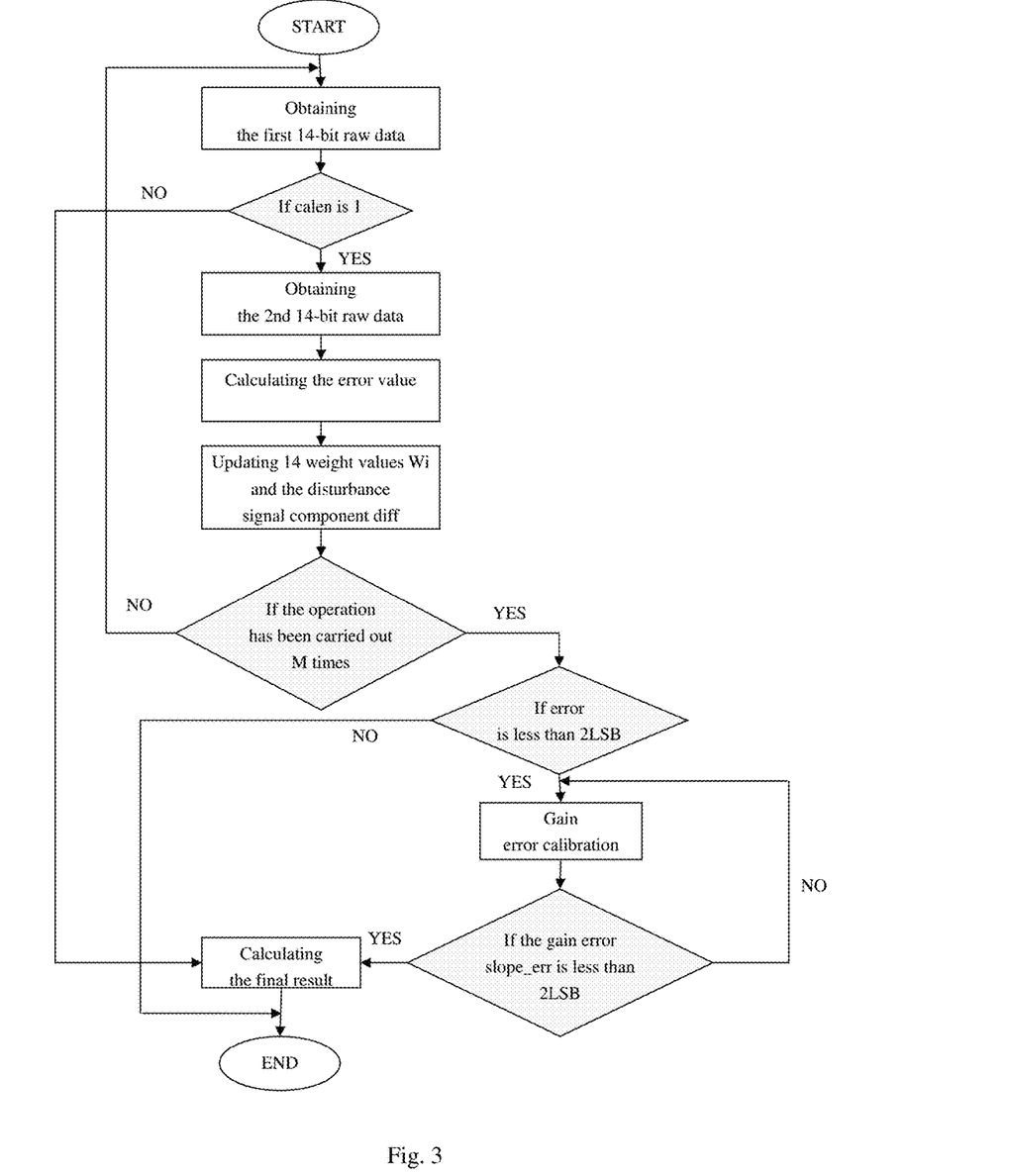
FIG. 3 is a flow chart of the method of the example of the present invention.

As shown in FIG. 3 is a flow chart of the method of the example of the present invention. The control module 4 controls the operational state of the entire adaptive filtering digital calibration circuit 2 and controls to complete all the calibration algorithmic operation, which includes the following steps:

Step 1: Before the adaptive algorithmic operation is started, an external ADC 1 provides an original binary value raw_data without calibration, which is a fourteen-bit datum and represented as raw_data[13:0]. When the signal "calen" is low, the original fourteen-bit datum is obtained only once, with the result operation started directly; when the signal "calen" is high, the data collection needs to be completed twice, which are raw_data1 (adding a disturbance component) and raw_data2 (subtracting a disturbance component), respectively, with the algorithmic operation started. That is, the control module 4 controls to obtain the first original binary value raw_data from the external ADC1 and, when the calibration enable signal is in an enable state, i.e., the signal "calen" is high, to obtain a second original binary value, and then going to Step 2; when the calibration enable signal is in an disable state, i.e., the signal "calen" is low, the control module 4 controls to obtain the first original binary value before going to Step 4 directly.

Step 2: Calculating an error value according to weight and disturbance signals, and carrying out the weight updating operation and the disturbance signal updating operation according to the error value; after completing the updating operation, judging whether the updating operation has been carried out for M times, wherein M is greater than one; if the updating operation has been carried out for M times, it is judged whether the error value is less than 2 LSB; if the error value is less than 2 LSB, a gain calibration operation is carried out, with the updated weight as the optimal weight, otherwise the operation is directly stopped, and a high pulse of one cycle is outputted at an "error" port of the control module 4; if the updating operation is carried out less than M times, Step 1 will be carried out again.

A formula for calculating the error value is as follows:

$$[\text{error}]_c = \sum_{i=0}^{k} \{[2 \times (b_{i+} - b_{i-}) \times w_i]_c\} + [-2 \times \text{diff}]_c$$

Wherein [ ]c represents that a complemental code is used for representation; "error" represents an error value; k represents the number of bits of the first original binary value and the second original binary value, with k being 14 because the original binary value raw_data is a fourteen-bit datum in the example of the present invention; Wi represents the weight value to which the $i^{th}$ bit of the first original binary value corresponds, with the weight values to which the $i^{th}$ bits of the first original binary value and the second original binary value correspond being the same; and "diff" represents the value of the disturbance signal.

In the calculation of the error value, the addition operation needs to be completed fourteen times, which is completed by the two fixed-point adders 8 through the parallel operation; when an operand in the addition operation is Wi, the value of the corresponding two-bit data encoding indication signal is {bi+, bi−}; when the operand in the addition operation is "diff", the value of the corresponding two-bit data encoding indication signal is 01. With the operand being Wi and diff, the shift register 7 carries out operation of moving left by one bit to complete multiplication by 2.

In the above operation, [ ]c represents that a complemental code is used for representation, that is, all the data are in the format of a complemental code in the addition operation, so as to facilitate addition/subtraction operation of data in an adder, with all the intermediate values in the format of a complemental code.

The weight updating formula is as follows:

$$[W_{i(n+1)}]_c = [W_{i(n)}]_c + U \times [-(b_{i+} - b_{i-}) \times \text{error}_{(n)}]_c$$

Wi(n) represents a weight value before the $n^{th}$ update to which the $i^{th}$ bit of the first original binary value corresponds; error(n) represents an error value before the $n^{th}$ update; Wi(n+1) represents a weight value after the $n^{th}$ update to which the $i^{th}$ bit of the first original binary value corresponds; that is, a parameter with n represents a parameter used in the final error operation. In the example of the present invention, the weight updating needs the fixed-point addition operation fourteen times, which is completed by an adder under the control of the control module.

The weight updating formula is applicable to the weight with the value of i from 0 to k−1; $W_k$ represents a weight value of the highest bit, with the initial value of $W_k$ as a fixed value and not changing during update; when i is from 0 to k−1, the initial value of the weight $W_i$ is 0, i.e., the initial value of W13 is a fixed value and will not change during update, with all the initial values of W12 to W0 being 0.

U represents a convergence factor; in the example of the present invention, the convergence factor u selects a fixed step of $(0.000001)_2$ and, when the corresponding operand, i.e. "error", is outputted from the register 6, the operation of first moving right by 6 bits is completed under the control of the signal s_state.

The value of the corresponding two-bit data encoding indication signal is $\{b_{i-}, b_{i+}\}$ when the operand in the weight updating operation is error(n), and it is 10 when the operand is $W_{i(n)}$.

The disturbance signal updating formula is as follows:

$$[\text{diff}_{(n+1)}]_c = [\text{diff}_{(n)}]_c + U \times [\text{error}_{(n)}]_c$$

Wherein $\text{diff}_{(n)}$ represents the value of the disturbance signal before the $n^{th}$ update, and $\text{diff}_{(n+1)}$ represents the value of the disturbance signal after the $n^{th}$ update; the value of the two-bit data encoding indication signal of the addend and augend in the update of the disturbance signal is 10.

After updating the weight and the disturbance component value, i.e. the disturbance signal, if the entire algorithmic process is repeated less than M times, returning to obtain the original fourteen-bit datum, calculating the error "error", and updating the weight and the disturbance component value. If the entire algorithmic process is repeated more than or equal to M times, the value of the error "error" is less than 2 LSB, indicating that the optimal weight has been obtained, then going to the gain calibration operation; if the gain adjustment coefficient "slope" of the output characteristic curve of ADC has been obtained, going to the result operation directly; if the error value is greater than 2 LSB, a port signal "error" outputs a high pulse signal of one clock cycle.

Step 3: Carrying out the gain calibration operation: first calculating the optimal weight sum, then carrying out a gain correction operation by constantly adjusting a gain coefficient of an output characteristic curve of ADC until a gain error is less than 2 LSB, and then going to Step 4.

A formula for calculating the optimal weight sum in the gain calibration operation is as follows:

$$[\text{sum\_w}_{quant}]_c = \sum_{i=0}^{k} [W_{iopt}]_c$$

$W_{iopt}$ represents the optimal weight value to which the $i^{th}$ bit of the first original binary value corresponds, k represents the number of bits of the first original binary value and the second original binary value, and sum_$w_{quant}$ represents the optimal weight sum.

The gain correction operation of the gain calibration operation includes the following substeps:

Step 31: Completing the following multiplication operation by the fixed-point multiplier 9 under the control of the control module 4:

sum_temp=slope×sum_$w_{quant}$

Wherein "slope" represents a gain correction coefficient, and sum_temp represents a gain correction coefficient weighted product.

Step 32: Completing the following gain correction error calculation by one of the fixed-point adders 8 under the control of the control module 4:

[slope_err]$_c$=16383+[−sum_temp]$_c$

Wherein slope_err represents the gain correction error; the value of the corresponding two-bit data encoding indication signal is 01 when the operand is sum_temp; if the calculated slope_err is less than 2 LSB, it is indicated that the gain correction coefficient has been found, thus going to Step 4 directly, otherwise going to Step 33.

Step 33: Updating the gain correction coefficient by the following formula:

[slope(m+1)]$_c$=[slope(m)]$_c$+[slope_err(m)×0.5]$_c$× 2.44×10$^{-4}$

Wherein slope(m) represents the gain correction coefficient of an error value before the $m^{th}$ update, slope(m+1) represents the gain correction coefficient of an error value after the $m^{th}$ update, and slope_err(m) represents the gain correction error before the $m^{th}$ update; slope_err(m) first completes the operation of moving right by 13 bits through the shift register under the control of "s_state", with the values of the two-bit data encoding indication signal to which the operands slope(m) and slope_err(m) in the addition correspond both being 10; returning to Step 31 after updating the gain correction coefficient.

Step 4: Carrying out a final result operation: the final result operation means that weighted addition is carried out by a sampling optimal weight on individual bits of the first original binary value to obtain the summed value, which is then multiplied by the gain factor; after the final result operation, giving out a data result from a "bincode" port of the control module 4, and outputting a high pulse signal of one cycle from a "eoc" port.

A formula for the final result operation is as follows:

$$\text{result} = \left\{ \sum_{i=0}^{k} bi \times W_{iopt} \right\} \times \text{slope}$$

Wherein "result" represents a final result; k represents the number of bits of the first original binary value; bi represents the value of the $i^{th}$ bit of the first original binary value when the calibration enable signal is disabled, and bi represents the number of the $i^{th}$ bit of a sum of the first original binary value and the second original binary value when the calibration enable signal is enabled; $W_{iopt}$ represents the optimal weight value to which the $i^{th}$ bit of the first original binary value corresponds; and "slope" represents a gain adjustment coefficient; finally "bincode" selects $24^{th}$ to $13^{th}$ bits of the "result" to output. The final result operation needs the fixed-point addition operation totally 13 times, with the addition operation in calculation of the final result operation carried out by a plurality of the fixed-point adders 8 through parallel operation; the value of the corresponding two-bit data encoding indication signal is determined by $b_{i+}$ when the operand in the addition operation is $W_{iopt}$; the value of the corresponding two-bit data encoding indication signal is 10 when $b_{i+}$ is 1, otherwise 00; the multiplication operation in the calculation is carried out by the fixed-point multiplier.

The present invention is described above in detail through specific examples, which, however, do not restrict the present invention. Without departing from the principle of the present invention, those skilled in the art may also make many variations and improvements, which should also be considered to be within the scope of protection of the present invention.

What is claimed is:

1. An adaptive filtering digital calibration circuit of ADC (Analog to Digital Converter), the adaptive filtering digital calibration circuit comprising a control module, a plurality of fixed-point adders, and a fixed-point multiplier; the control module comprising a finite-state machine, a shift register, and a register array;

wherein the plurality of the fixed-point adders are used for parallel addition operation, with each of the plurality of the fixed-point adders including three input terminals and two output terminals, respectively, the three input terminals being used for inputting an addend, an augend and a data encoding indication signal, respectively, a first output terminal used for outputting a data overflow indication signal, the other output terminal being used for outputting an addition result; the data encoding indication signal provided by the finite-state machine and includes four bits, the addend and the augend are changed in format under control of a two-bit signal of the data encoding indication signal, respectively, and one of the plurality of the fixed-point adders carries out an addition operation on the addend and the augend after the change in format;

the control module controls an operational state of the adaptive filtering digital calibration circuit and controls to complete all calibration algorithmic operation, which includes:

Step 1: the control module obtains a first original binary value from an external ADC and:

(a) when a calibration enable signal is in an enable state, the control module obtains a second original binary value from the external ADC and proceeds to Step 2;

(b) when the calibration enable signal is in a disable state, the control module obtains the first original binary value and skips Steps 2 and 3 and proceeds directly to Step 4;

Step 2: calculating an error value according to weight and disturbance signals, and carrying out a weight updating operation and a disturbance signal updating operation according to the error value; judging whether the weight updating operation has been carried out for M times, wherein M is greater than 1; if the weight updating operation is carried out less than M times, Step 1 will be carried out again; if the weight updating operation has been carried out for M times, it is judged whether the error value is less than 2 LSB; if the error value is less than 2 LSB, a gain calibration operation is carried out, with the updated weight as an optimal weight, and then proceed to Step 3; otherwise a high pulse of one cycle is outputted at an "error" port of the control module and all the calibration algorithmic operations are terminated;

Step 3: carrying out a gain calibration operation by first calculating an optimal weight sum based on the optical weight in Step 2, then carrying out a gain correction operation by constantly adjusting a gain coefficient of an output characteristic curve of ADC until a gain error is less than 2 LSB, and then going to Step 4;

Step 4: carrying out a final result operation by carrying out a weighted addition by sampling an optimal weight on individual bits of the first original binary value to obtain a summed value, which is then multiplied by a gain factor; after the final result operation, giving out a data result from a "bincode" port of the control module, and outputting a high pulse signal of one cycle from a port of control module ("eoc" port).

2. The adaptive filtering digital calibration circuit of ADC according to claim 1, wherein: a formula for calculating the error value in Step 2 is as follows:

$$[\text{error}]_c = \sum_{i=0}^{k} \{[2 \times (b_{i+} - b_{i-}) \times w_i]_c\} + [-2 \times \text{diff}]_c = [2 \times (b_{0+} - b_{0-}) \times w_0]_c + [2 \times (b_{1+} - b_{1-}) \times w_2]_c + \ldots + [2 \times (b_{k+} - b_{k-}) \times w_k]_c + [-2 \times \text{diff}]_c$$

wherein [ ]c means that a complementary code is used for representation; "error" represents an error value; k represents a number of bits of the first original binary value and the second original binary value; $W_k$ represents a weight value of the highest bit, with the initial value of $W_k$ as a fixed value and not changing during update; $b_{i+}$ represents a value of an $i^{th}$ bit of the first original binary value; $b_{i-}$ represents a value of an $i^{th}$ bit of the second original binary value; $w_i$ represents a weight value to which the $i^{th}$ bit of the first original binary value corresponds, with the weight value to which the $i^{th}$ bits of the first original binary value and a weight value to which the $i^{th}$ bits of the second original binary value correspond being the same; and "diff" represents the value of the disturbance signal;

the addition operation in the formula for calculating the error value is carried out by each of the plurality of the fixed-point adders through parallel operation; when an operand in the addition operation is $w_i$, the value of the corresponding two-bit data encoding indication signal is $\{b_{i+}, b_{i-}\}$; when the operand in the addition operation is "diff", the value of the corresponding two-bit data encoding indication signal is 01; and the shift register carries out operation of moving left by one bit to complete multiplication by 2.

3. The adaptive filtering digital calibration circuit of ADC according to claim 2, comprising a formula for carrying out the weight updating operation is as follows:

$$[W_{i(n+1)}]_c = [W_{i(n)}]_c + U \times [-(b_{i+} - b_{i-}) \times \text{error}_{(n)}]_c$$

wherein:
$W_{i(n)}$ represents a weight value before an $n^{th}$ update to which the $i^{th}$ bit of the first original binary value corresponds; error(n) represents an error value before the $n^{th}$ update; $W_{i(n+1)}$ represents a weight value after the $n^{th}$ update to which the $i^{th}$ bit of the first original binary value corresponds, with the weight updating formula applicable to the weight with the value of i from 0 to k−1; when i is from 0 to k−1, an initial value of weight $W_i$ is 0; U represents a convergence factor; the value of the corresponding two-bit data encoding indication signal is $\{b_{i-}, b_{i+}\}$ when an operand in the weight updating operation is error(n), and it is 10 when the operand is $W_{i(n)}$;

a formula for updating the disturbance signal in Step 2 is as follows:

$$[\text{diff}_{n+1}]_c = [\text{diff}_{(n)}]_c + U \times [\text{error}_{(n)}]_c$$

$\text{diff}_{(n)}$ represents the value of the disturbance signal before an $n^{th}$ update, and $\text{diff}_{(n+1)}$ represents the value of the disturbance signal after the $n^{th}$ update; the value of the two-bit data encoding indication signal of the addend and augend in the update of the disturbance signal is 10.

4. The adaptive filtering digital calibration circuit of ADC according to claim 1 wherein a formula for calculating the optimal weight sum in the gain calibration operation in Step 3 is as follows:

$$[\text{sum\_w}_{quant}]_c = \sum_{i=0}^{k} [W_{iopt}]_c$$

wherein:
$W_{iopt}$ represents an optimal weight value to which an $i^{th}$ bit of the first original binary value corresponds, k represents a number of bits of the first original binary value and the second original binary value, and $\text{sum\_w}_{quant}$ represents the optimal weight sum.

5. The adaptive filtering digital calibration circuit of ADC according to claim 4, wherein the gain correction operation of the gain calibration operation in Step 3 includes the following substeps:

Step 3(1): completing a multiplication operation by the fixed-point multiplier under the control of the control module:

$$\text{sum\_temp} = \text{slope} \times \text{sum\_W}_{quant}$$

wherein:
"slope" represents a gain correction coefficient, and sum_temp represents a weighted product of the gain correction coefficient;

Step 3(2): completing a gain correction error calculation by one of the plurality of the fixed-point adders under control of the control module:

$$[\text{slope\_err}]_c = 16383 + [-\text{sum\_temp}]_c$$

slope _err represents the gain correction error; the value of the corresponding two-bit data encoding indication signal is 01 when the operand is sum_temp; if the calculated $slope_{13}$ err is less than 2 LSB, it is indicated that the gain correction coefficient has been found, thus going to Step 4directly, otherwise going to Step 3(3); and Step 3(3): updating the gain correction coefficient by a formula as follows:

$$[slope(m+1)]_c=[slope(m)]_c+[slope\_err(m)\times 0.5]_c\times 2.44\times 10^{-4}$$

slope(m) represents the gain correction coefficient of an error value before an $m^{th}$ update, slope(m+1) represents the gain correction coefficient of an error value after the $m^{th}$ update, and slope_err(m) represents the gain correction error before the $m^{th}$ update; slope_err(m) first completes operation of moving right by 13 bits through the shift register, with the values of the two-bit data encoding indication signal to which the operands slope (m) and slope_err(m) in the addition correspond both being 10; returning to Step 3(1) after updating the gain correction coefficient.

6. The adaptive filtering digital calibration circuit of ADC according to claim 1, wherein a formula for the final result operation in Step 4 is as follows:

$$result = \left\{\sum_{i=0}^{k} bi \times W_{iopt}\right\} \times slope$$

"result" represents a final result; k represents the number of bits of the first original binary value; bi represents a value of an $i^{th}$ bit of the first original binary value when the calibration enable signal is disabled, and bi represents a number of an $i^{th}$ bit of a sum of the first original binary value and the second original binary value when the calibration enable signal is enabled; $W_{iopt}$ represents an optimal weight value to which the $i^{th}$ bit of the first original binary value corresponds; and "slope" represents a gain adjustment coefficient; the addition operation in calculation of the final result operation is carried out by each of the plurality of the fixed-point adders through parallel operation; with the value of the corresponding two-bit data encoding indication signal determined by bi when the operand in the addition operation is Wiopt, the value of the corresponding two-bit data encoding indication signal is 10when bi is 1, otherwise 00, with the multiplication operation in the calculation carried out by the fixed-point multiplier.

7. A method of adaptive filtering digital calibration of ADC, wherein calibration is carried out by an adaptive filtering digital calibration circuit, which comprises a control module, a plurality of fixed-point adders, and a fixed-point multiplier; the control module comprises a finite-state machine, a shift register, and a register array;

the plurality of the fixed-point adders are used for parallel addition operation, with each of the plurality of the individual fixed-point adders including 3 input terminals and 2output terminals, respectively, the 3 input terminals being used for inputting an addend, an augend and a data encoding indication signal, respectively, a first output terminal used for outputting a data overflow indication signal, the other output terminal being used for outputting an addition result; the data encoding indication signal provided by the finite-state machine and includes 4 bits, the addend and the augend are changed in format under control of a two-bit signal of the data encoding indication signal, respectively, and one of the plurality of the fixed-point adders carries out an addition operation on the addend and the augend after the change in format;

the control module controls the operational state of the adaptive filtering digital calibration circuit and controls to complete all calibration algorithmic operation, which includes:

Step 1: the control module obtains a first original binary value from an external ADC and:

(a) when a calibration enable signal is in an enable state, the control module obtains a second original binary value, and proceeds to Step 2;

(b) when the calibration enable signal is in a disable state, the control module obtains the first original binary value and skips Step 2 and 3 and proceeds to Step 4;

Step 2: calculating an error value according to weight and disturbance signals, and carrying out a weight updating operation and a disturbance signal updating operation according to the error value; judging whether the weight updating operation has been carried out for M times, wherein M is greater than 1; if the updating operation is carried out less than M times, Step 1 will be carried out again; if the weight updating operation has been carried out for M times, it is judged whether the error value is less than 2 LSB; if the error value is less than 2 LSB, a gain calibration operation is carried out, with the updated weight as the optimal weight, otherwise a high pulse of one cycle is outputted at an "error" port of the control module and all the calibration algorithmic operations are terminated;

Step 3: carrying out a gain calibration operation by first calculating an optimal weight sum based on the optical weight in Step 2, then carrying out a gain correction operation by constantly adjusting a gain coefficient of an output characteristic curve of ADC until a gain error is less than 2 LSB, and then going to Step 4;

Step 4: carrying out a final result operation: by carrying out a weighted addition by sampling an optimal weight on individual bits of the first original binary value to obtain the summed value, which is then multiplied by the gain factor; after the final result operation, giving out a data result from a "bincode" port of the control module, and outputting a high pulse signal of one cycle from a port of control module ("eoc" port).

8. The method of adaptive filtering digital calibration of ADC according to claim 7, wherein a formula for calculating the error value in Step 2 is as follows:

$$[error]_c = \sum_{i=0}^{k} \{[2\times(b_{i+}-b_{i-})\times w_i]_c\} + [-2\times diff]_c$$

wherein [ ]c represents that a complementary code is used for representation; "error" represents an error value; k represents the number of bits of the first original binary value and the second original binary value; $b_{i+}$ represents the value of the $i^{th}$ bit of the first original binary value; $b_{i-}$ represents the value of the $i^{th}$ bit of the second original binary value; $W_i$ represents the weight value to which the $i^{th}$ bit of the first original binary value corresponds, with the weight values to which the $i^{th}$ bits of the first original binary value and the second original binary value correspond being the same; and "diff" represents the value of the disturbance signal;

the addition operation in calculation of the error value is carried out by a plurality of the fixed-point adders through parallel operation; when an operand in the addition operation is $W_i$ the value of the corresponding two-bit data encoding indication signal is $\{b_{i+}, b_{i-}\}$; when the operand in the addition operation is "diff", the value of the corresponding two-bit data encoding indication signal is 01; and the shift register carries out operation of moving left by one bit to complete multiplication by 2.

9. The method of adaptive filtering digital calibration of ADC according to claim 8, wherein the weight updating formula in Step 2 is as follows:

$$[W_{(n+1)}]_c = [W_{i(n)}]_c + U \times [-(b_{i+} - b_{i-}) \times \text{error}_{(n)}]_c$$

$W_{i(n)}$ represents a weight value before the $n^{th}$ update to which the $i^{th}$ bit of the first original binary value corresponds; error(n) represents an error value before the $n^{th}$ update; $W_{i(n+1)}$ represents a weight value after the $n^{th}$ update to which the $i^{th}$ bit of the first original binary value corresponds, with the weight updating formula applicable to the weight with the value of i from 0 to k−1; $W_k$ represents a weight value of the highest bit, with the initial value of $W_k$ as a fixed value and not changing during update; when i is from 0 to k−1, the initial value of the weight $W_i$ is 0; U represents a convergence factor; the value of the corresponding two-bit data encoding indication signal is $\{b_{i-}, b_{i+}\}$ when the operand in the weight updating operation is error(n), and it is 10 when the operand is $W_{i(n)}$;

a formula for updating the disturbance signal in Step 2 is as follows:

$$[\text{diff}_{(n+1)}]_c = [\text{diff}_{(n)}]_c + U \times [\text{error}_{(n)}]_c$$

$\text{diff}_{(n)}$ represents the value of the disturbance signal before the $n^{th}$ update, and $\text{diff}_{(n+1)}$ represents the value of the disturbance signal after the $n^{th}$ update; the value of the two-bit data encoding indication signal of the addend and augend in the update of the disturbance signal is 10.

10. The method of adaptive filtering digital calibration of ADC according to claim 7 wherein a formula for calculating the optimal weight sum in the gain calibration operation in Step 3 is as follows:

$$[\text{sum\_w}_{quant}]_c = \sum_{i=0}^{k} [W_{iopt}]_c$$

$W_{iopt}$ represents the optimal weight value to which the $i^{th}$ bit of the first original binary value corresponds, k represents the number of bits of the first original binary value and the second original binary value, and sum_$W_{quant}$ represents the optimal weight sum.

11. The method of adaptive filtering digital calibration of ADC according to claim 10, wherein the gain correction operation of the gain calibration operation in Step 3 includes the following substeps:

Step 3(1): completing the following multiplication operation by the fixed-point multiplier under the control of the control module:

sum_temp=slope×sum_$W_{quant}$

"slope" represents a gain correction coefficient, and sum temp represents a gain correction coefficient weighted product;

Step 3(2): completing the following gain correction error calculation by one of the fixed-point adders under the control of the control module:

$$[\text{slope\_err}]_c = 16383 + [-\text{sum\_temp}]_c$$

slope_err represents the gain correction error; the value of the corresponding two-bit data encoding indication signal is 01 when the operand is sum_temp; if the calculated slope_err is less than 2 LSB, it is indicated that the gain correction coefficient has been found, thus going to Step 4 directly, otherwise going to Step 3 (3); and Step 3 (3): updating the gain correction coefficient by the following formula:

$$[\text{slope}(m+1)]_c = [\text{slope}(m)]_c + [\text{slope\_err}(m) \times 05]_c \times 2.44 \times 10^{-4}$$

slope(m) represents the gain correction coefficient of an error value before the $m^{th}$ update, slope(m+1) represents the gain correction coefficient of an error value after the $m^{th}$ update, and slope_err(m) represents the gain correction error before the $m^{th}$ update; slope_err(m) first completes the operation of moving right by 13 bits through the shift register, with the values of the two-bit data encoding indication signal to which the operands slope(m) and slope_err(m) in the addition correspond both being 10; returning to Step 3(1) after updating the gain correction coefficient.

12. The method of adaptive filtering digital calibration of ADC according to claim 7, wherein a formula for the final result operation in Step 4 is as follows:

$$\text{result} = \left\{ \sum_{i=0}^{k} bi \times W_{iopt} \right\} \times \text{slope}$$

"result" represents a final result; k represents the number of bits of the first original binary value; bi represents the value of the $i^{th}$ bit of the first original binary value when the calibration enable signal is disabled, and bi represents the number of the $i^{th}$ bit of a sum of the first original binary value and the second original binary value when the calibration enable signal is enabled; $W_{iopt}$ represents the optimal weight value to which the $i^{th}$ bit of the first original binary value corresponds; and "slope" represents a gain adjustment coefficient; the addition operation in calculation of the final result operation is carried out by a plurality of the fixed-point adders through parallel operation; with the value of the corresponding two-bit data encoding indication signal determined by bi when the operand in the addition operation is $W_{iopt}$, the value of the corresponding two-bit data encoding indication signal is 10 when bi is 1, otherwise 00, with the multiplication operation in the calculation carried out by the fixed-point multiplier.

* * * * *